(12) United States Patent
Cruz et al.

(10) Patent No.: US 7,102,934 B1
(45) Date of Patent: Sep. 5, 2006

(54) SENSE AMPLIFIER SYSTEMS AND METHODS

(75) Inventors: Louis De La Cruz, Pflugerville, TX (US); Allen White, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/435,956

(22) Filed: May 17, 2006

Related U.S. Application Data

(62) Division of application No. 10/797,759, filed on Mar. 9, 2004, now Pat. No. 7,068,556.

(51) Int. Cl.
   *G11C 7/10* (2006.01)

(52) U.S. Cl. .......... 365/189.05; 365/205; 365/185.25; 365/189.08

(58) Field of Classification Search .......... 365/189.05, 365/189.08, 185.25, 200
   See application file for complete search history.

(56) References Cited

U.S. PATENT DOCUMENTS

| | | | |
|---|---|---|---|
| 4,107,556 A | 8/1978 | Stewart et al. | |
| 5,361,227 A * | 11/1994 | Tanaka et al. | 365/185.22 |
| 5,867,443 A * | 2/1999 | Linderman | 365/228 |
| 5,973,992 A | 10/1999 | Casper | |
| 6,072,738 A | 6/2000 | Brown | |
| 6,195,277 B1 | 2/2001 | Sywyk et al. | |
| 6,285,583 B1 | 9/2001 | Cleveland et al. | |
| 6,324,110 B1 | 11/2001 | Leung et al. | |
| 6,418,073 B1 | 7/2002 | Fujita | |
| 6,618,313 B1 * | 9/2003 | Nguyen et al. | 365/227 |
| 2004/0196686 A1 * | 10/2004 | Kauffmann et al. | 365/154 |
| 2006/0034121 A1 * | 2/2006 | Khalid et al. | 365/185.19 |
| 2006/0034139 A1 * | 2/2006 | Shim | 365/230.03 |
| 2006/0087898 A1 * | 4/2006 | Xi | 365/189.09 |
| 2006/0120184 A1 * | 6/2006 | Song | 365/194 |

* cited by examiner

Primary Examiner—Tuan T. Nguyen

(57) ABSTRACT

Systems and methods including sense amplifiers for various applications. For example, in accordance with an embodiment of the present invention, a sense amplifier for a memory array having an associated precharge circuit and a read completion detection circuit.

10 Claims, 5 Drawing Sheets

SENSE AMPLIFIER SYSTEMS AND METHODS

RELATED APPLICATION DATA

This application is a divisional of application Ser. No. 10/797,759, filed Mar. 9, 2004, now U.S. Pat. No. 7,068,556 issued on Jul. 27, 2006.

TECHNICAL FIELD

The present invention relates generally to electrical circuits and, more particularly, to sense amplifiers.

BACKGROUND

Sense amplifiers are employed in a variety of applications to monitor data signals and provide output signals based on the data signals. For example, a sense amplifier typically is utilized in a memory array to read data from one or more bitlines. The bitlines are generally routed from a memory cell in the memory array to the sense amplifier via column decode pass gates. The sense amplifier reads the data and provides its output, which completes the read process.

One drawback of some conventional sense amplifier applications, such as for example for a memory array, is the relatively long time delay from the start of a read to the start of the next read (i.e., read cycle time). One technique to reduce the amount of time required to complete a read cycle is to precharge the bitlines prior to each read. However, typically there is still a relatively long read cycle time, especially with large memory arrays having significant signal propagation delays. As a result, there is a need for improved sense amplifier techniques.

SUMMARY

Systems and methods are disclosed herein to provide sense amplifiers for various applications. For example, in accordance with an embodiment of the present invention, a sense amplifier is disclosed having an associated precharge circuit and a read completion detection circuit. The precharge circuit and the read completion detection circuit reduce the amount of time required to complete a read cycle as compared to some conventional sense amplifier circuits. Additional logic circuits may be provided to provide the desired application granularity so that the techniques disclosed herein may apply, for example, to one, four, eight, or more bits at a time.

More specifically, in accordance with one embodiment of the present invention, a sense amplifier circuit includes a sense amplifier coupled to a first input line and a second input line and adapted to receive an enable signal, wherein the enable signal controls whether the sense amplifier is enabled; a first inverter coupled to the first input line and adapted to provide a first output signal; a second inverter coupled to the second input line and adapted to provide a second output signal; and a logic gate adapted to receive the first output signal and the second output signal and to provide a trip signal.

In accordance with another embodiment of the present invention, a memory array includes a plurality of sense amplifiers adapted to read data provided on bitlines; a plurality of corresponding precharge circuits adapted to precharge the bitlines coupled to the sense amplifiers; a plurality of corresponding inverters coupled to the bitlines and adapted to provide output signals based on signal levels on the bitlines coupled to the sense amplifiers; a plurality of corresponding logic gates adapted to receive the output signals from the corresponding inverters and to provide trip signals based on the output signals; and a plurality of corresponding latches adapted to store the output signals from one of the corresponding inverters under control of the corresponding trip signals, wherein the trip signals transition to a first value if the corresponding bitlines are precharged and transition to a second value if the corresponding sense amplifiers read the data on the corresponding bitlines.

In accordance with another embodiment of the present invention, a method of reading data from data lines includes disabling a sense amplifier coupled to the data lines; precharging the data lines; providing a first signal value via inverters coupled to the data lines about when the data lines are precharged; providing the data on the data lines about when the first signal value is provided; enabling the sense amplifier to read the data placed on the data lines about when the first signal value is provided; and providing a second signal value via the inverters coupled to the data lines about when the sense amplifier has read the data placed on the data lines.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
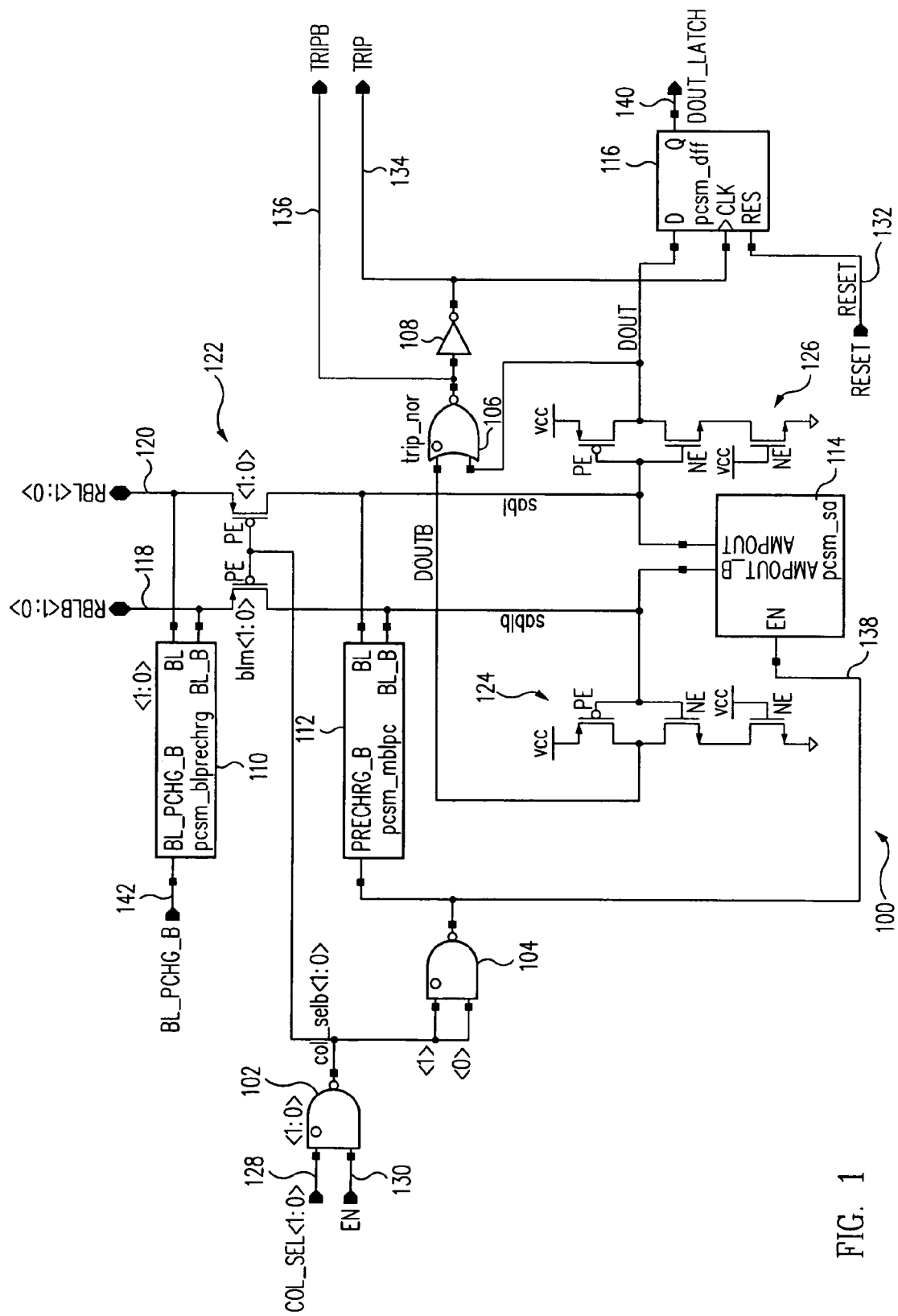
FIG. 1 shows a circuit diagram utilizing a sense amplifier in accordance with an embodiment of the present invention.

FIG. 1 shows a circuit 100 in accordance with an embodiment of the present invention. Circuit 100 represents, for example, a portion of a memory array and illustrates certain aspects of the present invention. However, it should be understood that one or more of the techniques disclosed herein are applicable to a number of different types of sense amplifier applications, such as for example for sense amplifier applications within a product term circuit of a programmable logic device.

Circuit 100 includes logic gates 102, 104, 106, and 108, precharge circuits 110 and 112, a sense amplifier 114, a latch 116, pass gates 122, and inverters 124 and 126. In terms of general operation, when a column select signal 128 and an enable signal 130 are asserted (e.g., a logical high level), logic gate 102 (e.g., a NAND gate) switches on pass gates 122, while logic gate 104 (e.g., a NAND gate) switches off precharge circuit 112 and switches on sense amplifier 114 via an enable signal 138 to initiate a read operation of bitlines 118 and 120 by sense amplifier 114.

Precharge circuit 110, in general, is switched off at approximately the same time as when precharge circuit 112 is switched off to allow sense amplifier 114 to read the values on bitlines 118 and 120 from the selected memory cell (not shown). Precharge circuit 110 is switched on to precharge bitlines 118 and 120 (e.g., globally within the memory array of which circuit 100 forms a part of) after the completion of a read cycle (e.g., after all trip signals, such as a trip signal 134 described herein, are asserted and the selected word line for the read cycle has been deasserted). In general, bitlines 118 and 120 (e.g., globally and locally to sense amplifier 114) must be precharged prior to each read by sense amplifier 114.

Inverters 124 and 126 are coupled to bitlines 118 and 120 leading into sense amplifier 114 and, along with logic gate 106 (e.g., a NOR gate), form a read completion detection circuit. A trip signal 136 provided by logic gate 106 transitions to a logical low level (or its complement, a trip signal 134, transitions to a logical high level) once a read operation is completed by sense amplifier 114. Trip signal 136 remains at a logical low level until the precharging is completed by precharge circuit 112 of bitlines 118 and 120 (i.e., at the input to sense amplifier 114).

Inverters 124 and 126 help to isolate sense amplifier 114 from large capacitive loads and to provide their outputs (labeled DOUTB and DOUT, respectively) to logic gate 106. Inverters 124 and 126 are placed between bitlines 118 and 120 and logic gate 106 to reduce parasitic capacitances. For example, a logic gate (e.g., a NAND gate) connected directly to bitlines 118 and 120 (i.e., inverters 124 and 126 not implemented) would typically have parasitic capacitances associated with its n-channel field effect transistors (NFETS) that couple to nodes with different potentials within the logic gate and, consequently would not present identical loads to bitlines 118 and 120. Thus, there is the possibility of biasing sense amplifier 114, which could result in erroneous reads due to sense amplifier 114 tripping in one direction more easily than the other.

The output signal (labeled DOUT) from inverter 126 is also provided to latch 116 (e.g., a D flip flop), while trip signal 134 is utilized as a clock for latch 116. Latch 116 may also receive a reset signal 132 (e.g., a global reset). Latch 116 stores the result of a read operation by sense amplifier 114 and provides the result as an output signal 140.

By storing the result in latch 116, the precharge cycle for the next read operation can begin immediately. For example, when trip signal 136 transitions to a logical low level, enable signal 130 may transition to a logical low level (e.g., deasserted), which results in logic gate 102 switching off pass gates 122 and logic gate 104 switching off sense amplifier 114 and switching on precharge circuit 112 to begin charging bitlines 118 and 120 locally at sense amplifier 114. Precharge circuit 110 would begin precharging bitlines 118 and 120 globally within the memory array, for example, once all of the sense amplifiers within the memory array have completed their read operation and the selected word line has been deasserted.

Figure 2:
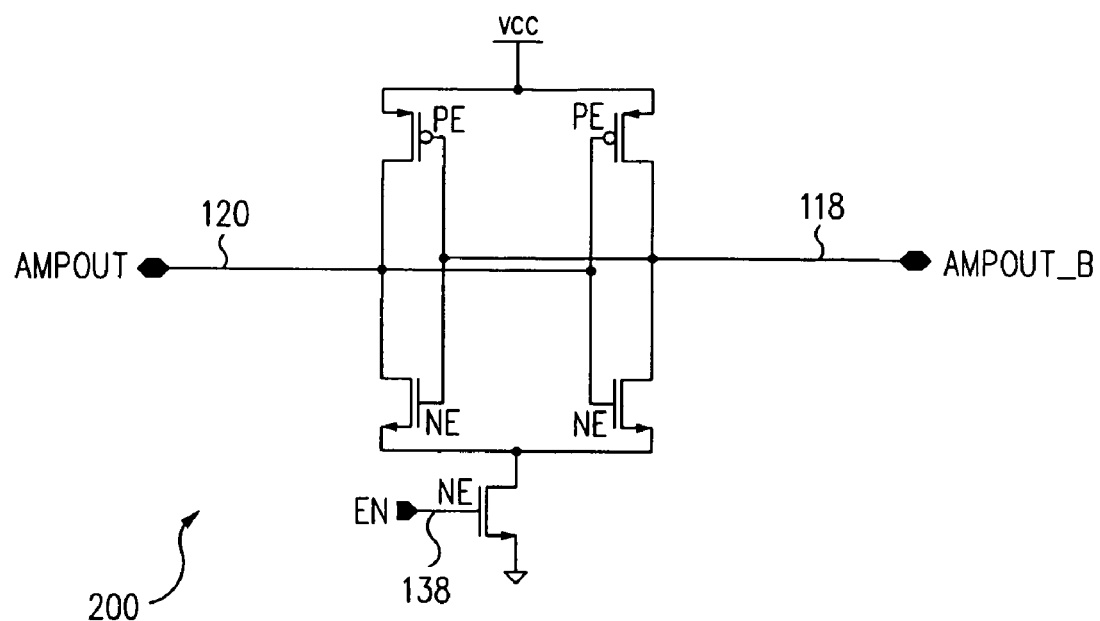
FIG. 2 shows an exemplary circuit for a portion of the circuit diagram of FIG. 1 in accordance with an embodiment of the present invention.

FIG. 2 shows a circuit 200, which is an exemplary circuit implementation for sense amplifier 114 of FIG. 1 in accordance with an embodiment of the present invention. Circuit 200 includes two cross-coupled inverters whose connection to a reference voltage (e.g., ground) is opened when enable signal 138 is deasserted. Thus, when enable signal 138 is asserted, circuit 200 performs a read operation of bitlines 118 and 120.

Figure 3:
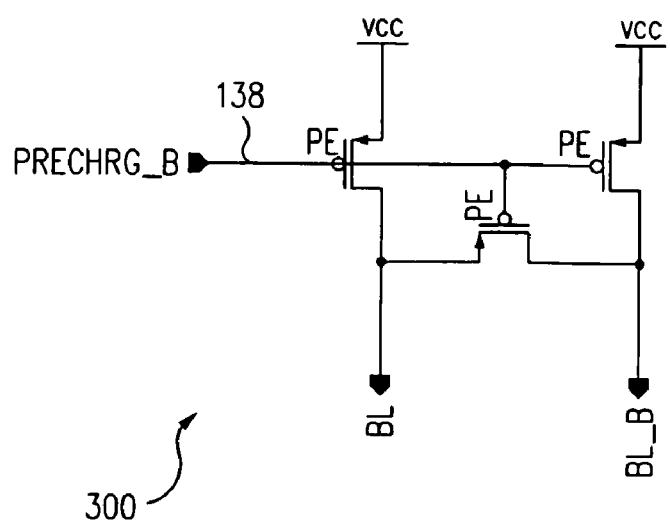
FIG. 3 shows an exemplary circuit for a portion of the circuit diagram of FIG. 1 in accordance with an embodiment of the present invention.

FIG. 3 shows a circuit 300, which is an exemplary circuit implementation for precharge circuit 112 of FIG. 1 in accordance with an embodiment of the present invention. Circuit 300 may also be an exemplary circuit implementation for precharge circuit 110, but its control signal would generally differ (i.e., enable signal 138 would be replaced, such as by a control signal 142 labeled BL_PCHG_B in FIG. 1) and transistor sizes may differ (e.g., transistor sizes for precharge circuit 110 would increase relative to precharge circuit 112), depending upon the size of the memory array with precharge circuit 110 generally having to precharge a longer portion of bitlines 118 and 120 than precharge circuit 112.

In general terms, circuit 100 includes a read completion detection circuit and a self-timed precharge circuit. Thus, circuit 100 detects when sense amplifier 114 has read a bit (also referred to as when sense amplifier 114 has tripped) on bitlines 118 and 120 (i.e., trip signal 136 transitions to a logical low level). Circuit 100 also detects when the inputs to sense amplifier 114 have completed their precharge cycle (i.e., when precharge circuit 112 has locally precharged bitlines 118 and 120 at sense amplifier 114) by monitoring trip signal 136 for a transition to a logical high level (or by monitoring its complement, trip signal 134).

It should be understood that circuit 100 may be extended to select from a number of bitline pairs. For example, column select signal 128 may represent complementary signals (as indicated by <1:0> notation in FIG. 1 and by a similar notation for other elements in FIG. 1), with logic gate 102 representing two logic gates, pass gates 122 representing two pairs of pass gates, and bitlines 118 and 120 representing two pairs of bitlines. Thus, the two pairs of pass gates 122 form a column multiplexer, which is controlled to select which pair of bitlines to route to sense amplifier 114. Precharge circuit 110 may also represent two precharge circuits, one for each pair of bitlines. Enable signal 130 would be fed to both logic gates represented by logic gate 102, with one of the column select signals routed to one logic gate and the complement routed to the other logic gate. In general, the description herein may reference certain figure elements (e.g., logic gate 102, pass gates 122, etc.) in a singular sense, but it should be understood that a number of these figure elements may be implemented, for example, to accommodate the selection of any number of bitline pairs to route to sense amplifier 114 in accordance with one or more embodiments of the present invention.

More than one sense amplifier 114 may be controlled by a control circuit (e.g., a sense amplifier controller). For example, depending on the actual granularity (e.g., a bit, a nibble, or a word) of the sense amplifier controllers for sense amplifiers 114 within the memory array, this technique may reduce the read precharge cycle time by eliminating the signal propagation delays associated with large memory arrays.

Figure 4:
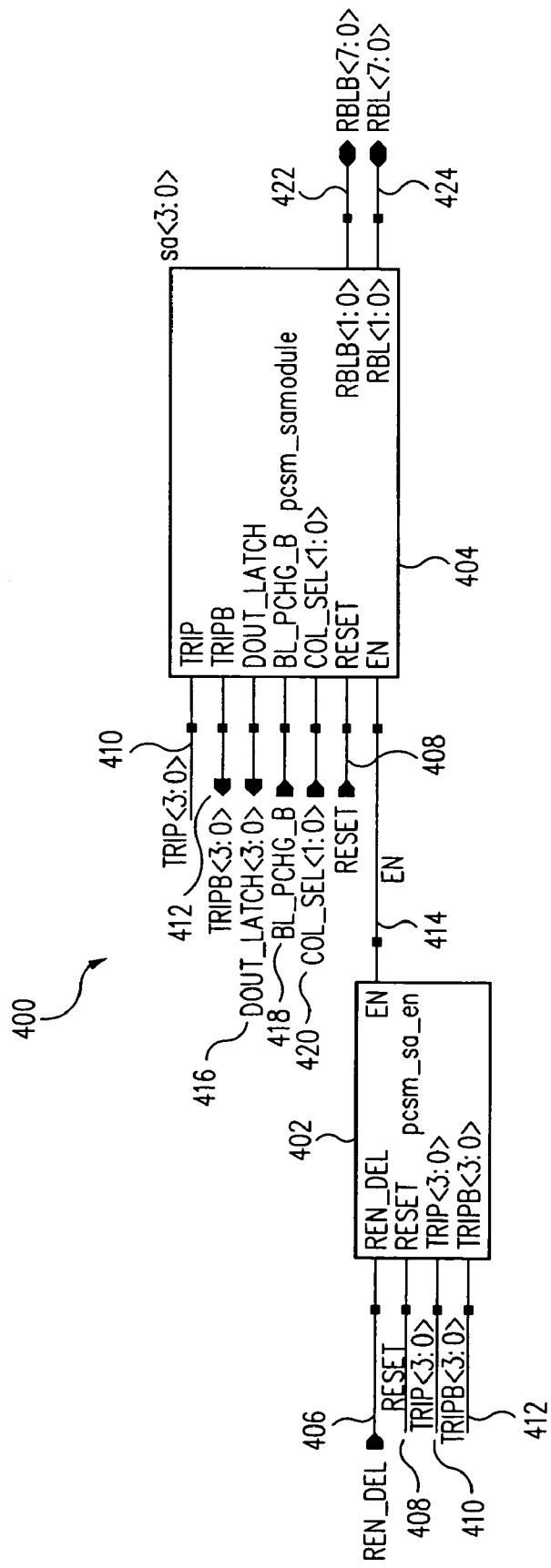
FIG. 4 shows a block diagram of a sense amplifier application in accordance with an embodiment of the present invention.

As an example, FIG. 4 shows a block diagram 400 for sense amplifier control in accordance with an embodiment of the present invention. In this exemplary implementation, a block 402 represents a sense amplifier controller, which provides an enable signal 414 to four sense amplifiers circuits (e.g., enable signal 414 corresponding to enable signal 130 is provided to control four of circuits 100) represented by a block 404 (i.e., block 404 represents four sense amplifier circuits, as indicated by the notation <3:0>, with each sense amplifier circuit selecting between two pairs of bitlines). For this example, block 402 controls the reading of four bits (i.e., a granularity of a nibble).

Block 402 receives a read enable signal 406, a reset signal 408, four trip signals 410, and four trip signals 412 (corresponding complements of trip signals 410) and provides enable signal 414 to block 404. Read enable signal 406 may be delayed appropriately so that sense amplifiers within block 404 are not enabled before their associated bitlines have started to separate in terms of their voltage. Reset signal 408 may be a global reset signal (e.g., the same signal as reset signal 132 of FIG. 1). Trip signals 410 and 412 provide true and complement trip signals from completion detection circuits within block 404, whose operation is as described similarly in reference to FIG. 1 for trip signals 134 and 136.

Block 404 provides trip signals 410 and 412, as discussed above, along with four output signals 416 and receives four control signals 418, two column select signals 420, reset signal 408, and eight bitlines 422 and 424. Output signals 416 provide the results from the four sense amplifiers as described similarly in reference to FIG. 1 for output signal 140. Similarly, control signals 418, column select signals 420, and bitlines 422 and 424 operate in a similar fashion as described similarly in reference to FIG. 1 for control signal 142, column select signal 128, and bitlines 118 and 120, respectively.

Figure 5:
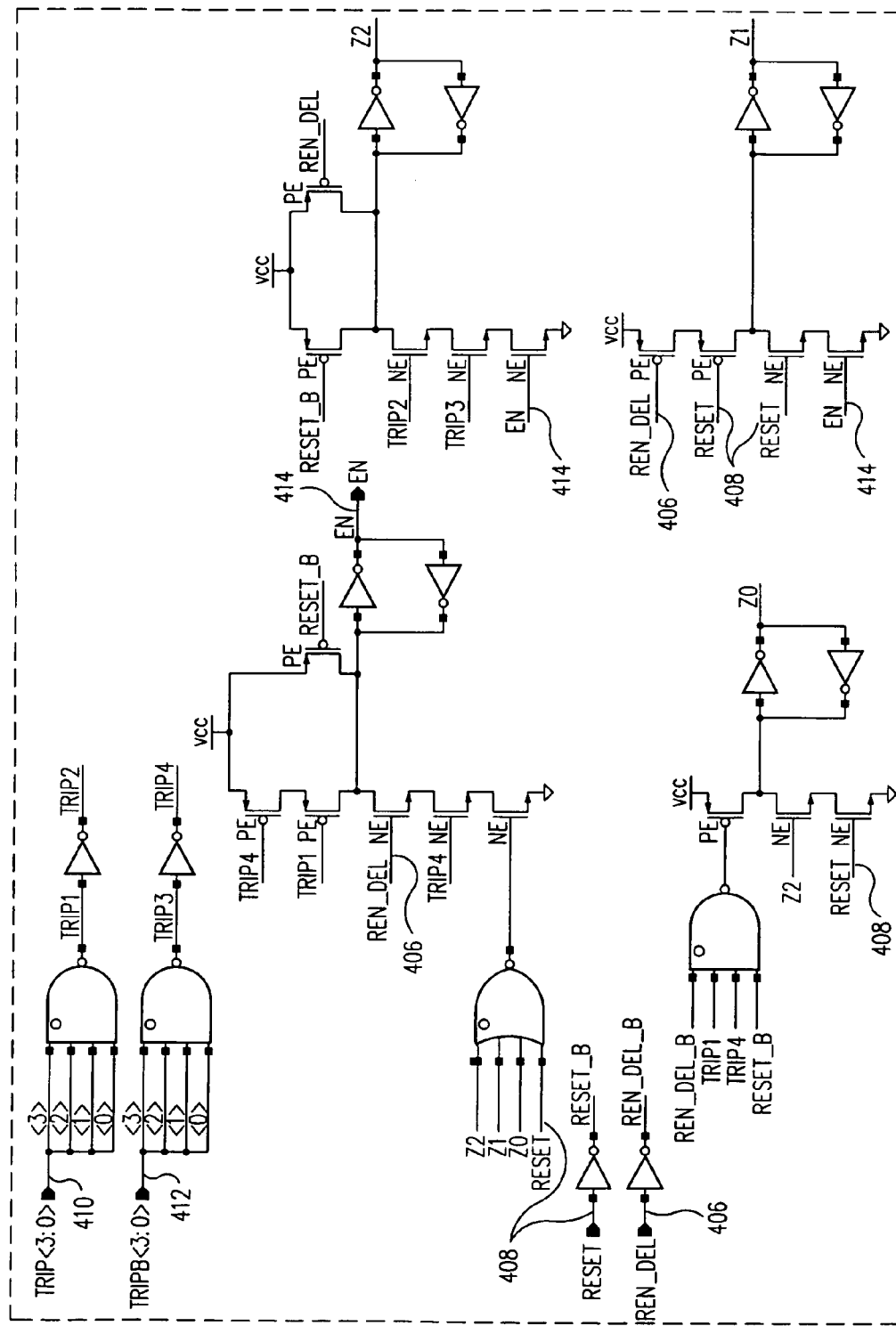
FIG. 5 shows a circuit diagram for a portion of the block diagram of FIG. 4 in accordance with an embodiment of the present invention.
Figure 6:
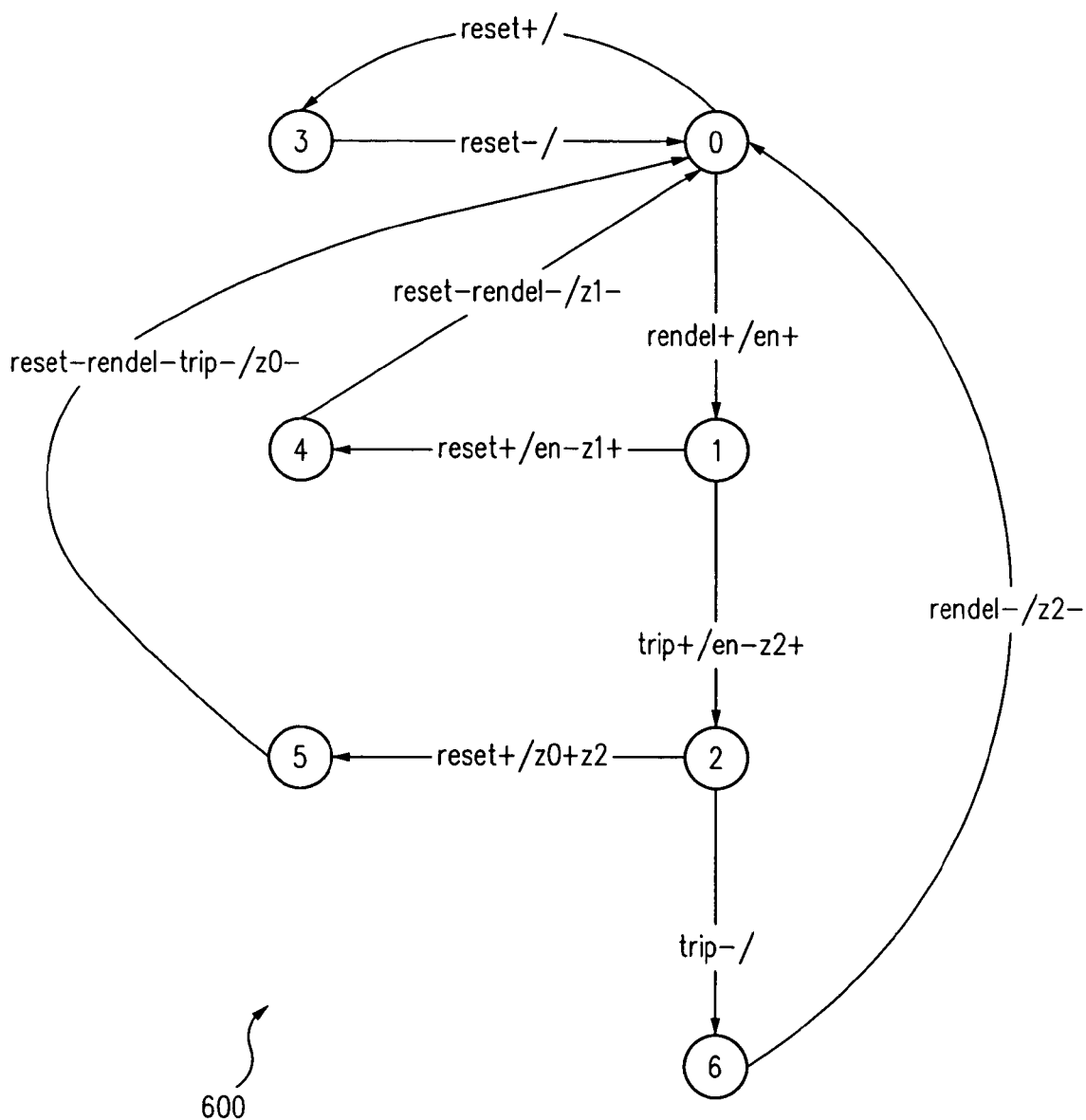
FIG. 6 shows a state diagram for the circuit diagram of FIG. 5 in accordance with an embodiment of the present invention.

FIG. 5 shows a circuit 500, which is an exemplary circuit implementation for block 402 of FIG. 4 in accordance with an embodiment of the present invention. FIG. 6 shows a state diagram 600 for circuit 500 of FIG. 5 in accordance with an embodiment of the present invention. In general, the appropriate signal may be chosen from trip1, trip2, trip3, and trip4 signals shown in FIG. 5 for state diagram 600, based on whether all of the trip signals should be logically high or logically low for a desired state transition and on the polarity required. Also, the signals listed to the left of the slash "/" indicate a transition or input, while the signals listed to the right of the slash "/" indicate a result of the transition or the input as a transition from one state to the next occurs.

For example, a transition from state zero to state three occurs if reset signal 408 is asserted, with a return to state zero when reset signal 408 is deasserted. As another example, when read enable signal 406 is asserted, enable signal 414 is asserted and a transition to state one occurs.

In general, when a transition to state one occurs, the column pass gates are enabled, the precharge circuits are switched off, and the sense amplifiers are switched on. When a transition to state two occurs (i.e., the trip signals from the monitored sense amplifiers are asserted), the sense amplifiers are switched off and the precharge of the bitlines begins again. When the precharge of the bitlines is completed, the trip signals are deasserted and a transition to state six occurs followed by a transition to state zero when read enable signal 406 is deasserted.

For the exemplary implementation described in reference to FIGS. 4 through 6, as an example, the trip signals from four adjacent bits (i.e., a nibble) may be fed to a single sense amplifier enable state machine. This level of granularity may accommodate various memory configurations of the memory array. Other levels of granularity, however, may be implemented based on one or more embodiments of the present invention and on the requirements of the desired application. In general, one of the basic functions of the sense amplifier enable state machine is to appropriately assert the enable signal when a read enable input signal is asserted, and appropriately deassert the enable signal when all of the trip signals are asserted (as described herein).

An exemplary basic sequence of events may be described, in accordance with an embodiment of the present invention, for a memory array implementing certain aspects of the present invention as described herein. First, a new read address and the read enable signal are latched into their input registers by a read clock. While the read address is decoded and the correct wordline is enabled, the registered read enable signal is delayed by a similar amount of time so that the sense amplifier is not enabled before the bitlines have started to separate in terms of their voltage.

The delayed read enable signal (e.g., read enable signal 406) is then received by a sense amplifier enable state machine (e.g., block 402), which enables a column multiplexer to connect the correct column bitlines to the local sense amplifier bitlines and terminates the precharge of the sense amplifier bitlines. The sense amplifier (e.g., sense amplifier 114) evaluates the bitlines and provides non-inverted and inverted data signals to the pair of inverters (e.g., inverters 124 and 126) that feed the NOR gate (e.g., logic gate 106). Because both bitlines were precharged high, the inverter outputs are both low at the start of the read.

As the data on the bitlines is resolved by the sense amplifier, either the DOUT or the DOUTB signal (from the respective inverters) goes high. This results in the output of the NOR gate to drop, which drives the trip signal (e.g., trip signal 134) high and latches the data into the output latch (e.g., latch 116). When all four of the trip signals going to the sense amplifier enable state machine have gone high, the column multiplexers are disabled, causing the precharge cycle to begin.

When the trip signal farthest from the read enable register transitions high, the read enable register is cleared, resulting in the registered read enable signal to go low. Once the sense amplifier precharge cycle is complete, the trip signal will go low, signaling the sense amplifier enable state machine that the sense amplifier is ready for the next read cycle.

Embodiments described above illustrate but do not limit the invention. It should also be understood that numerous modifications and variations are possible in accordance with the principles of the present invention. Accordingly, the scope of the invention is defined only by the following claims.

We claim:

1. A memory array comprising:
   a plurality of bitlines;
   a plurality of sense amplifiers coupled to the bitlines and adapted to read data provided on the bitlines;
   a plurality of precharge circuits adapted to precharge the bitlines; and
   a plurality of inverters coupled to the bitlines and adapted to provide output signals based on signal levels on the bitlines.

2. The memory array of claim 1 including:
   a plurality of logic gates adapted to receive the output signals from the inverters and to provide trip signals based on the output signals; and
   a plurality of latches adapted to store the output signals from at least one of the inverters under control of the trip signals.

3. The memory array of claim 2, wherein the sense amplifiers are disabled about when corresponding trip signals transition to a new value.

4. The memory array of claim 2, wherein the precharge circuits are enabled to precharge the bitlines about when corresponding trip signals transition to a new value.

5. The memory array of claim 2, further comprising a plurality of sense amplifier controllers each associated with one or more of the sense amplifiers, wherein a sense amplifier controller controls the enabling and disabling of an associated sense amplifier and precharge circuit based on an associated trip signal.

6. The memory array of claim 5, further comprising a plurality of column multiplexers adapted to couple selected data lines to the bitlines of sense amplifiers, wherein the column multiplexers are enabled by sense amplifier controllers.

7. A memory array comprising:
a plurality of bitlines;
a plurality of sense amplifiers coupled to the bitlines and adapted to read data provided on the bitlines;
a plurality of precharge circuits adapted to precharge the bitlines;
a plurality of inverters coupled to the bitlines and adapted to provide output signals based on signal levels on the bitlines;
a plurality of logic gates adapted to receive the output signals from the inverters and to provide trip signals based on the output signals; and
a plurality of latches adapted to store the output signals from at least one of the inverters under control of corresponding trip signals,
wherein the trip signals transition to a first value about when the bitlines are precharged and transition to a second value about when the sense amplifiers read the data on the bitlines.

8. The memory array of claim 7, wherein the sense amplifiers are disabled about when corresponding trip signals transition to the second value.

9. The memory array of claim 7, wherein the precharge circuits are enabled to precharge the bitlines about when corresponding trip signals transition to the second value.

10. A memory array comprising:
a plurality of bitlines;
a plurality of sense amplifiers coupled to the bitlines and adapted to read data provided on the bitlines;
a plurality of precharge circuits adapted to precharge the bitlines;
a plurality of inverters coupled to the bitlines and adapted to provide output signals based on signal levels on the bitlines;
a plurality of logic gates adapted to receive the output signals from the inverters and to provide trip signals based on the output signals; and
a plurality of sense amplifier controllers each associated with one or more of the sense amplifiers, wherein a sense amplifier controller controls the enabling and disabling of an associated sense amplifier and precharge circuit based on an associated trip signal.

* * * * *